United States Patent
Takahashi et al.

(10) Patent No.: US 11,253,927 B2
(45) Date of Patent: *Feb. 22, 2022

(54) COATED CUTTING TOOL

(71) Applicant: TUNGALOY CORPORATION, Fukushima (JP)

(72) Inventors: Kinya Takahashi, Iwaki (JP); Naoyuki Fukushima, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 111 days.

This patent is subject to a terminal disclaimer.

(21) Appl. No.: 16/741,395

(22) Filed: Jan. 13, 2020

(65) Prior Publication Data
US 2020/0230707 A1 Jul. 23, 2020

(30) Foreign Application Priority Data
Jan. 18, 2019 (JP) .............................. JP2019-006937

(51) Int. Cl.
*B23B 27/14* (2006.01)
*C23C 16/30* (2006.01)
(Continued)

(52) U.S. Cl.
CPC .......... *B23B 27/148* (2013.01); *C23C 16/308* (2013.01); *C23C 16/32* (2013.01);
(Continued)

(58) Field of Classification Search
CPC . B23B 27/14; B23B 27/148; B23B 2228/105; C23C 16/308; C23C 16/32; C23C 16/34; C23C 16/36; C23C 16/403
(Continued)

(56) References Cited

U.S. PATENT DOCUMENTS 4,357,382 A * 11/1982 Lambert ............... C23C 30/005
428/698
5,487,625 A 1/1996 Ljungberg et al.
(Continued)

FOREIGN PATENT DOCUMENTS

EP 1 905 870 A2 4/2008
JP H06-316758 A 11/1994
(Continued)

OTHER PUBLICATIONS

S. Ruppi, "Enhanced Performance of α-Al2O3 Coatings by Control of Crystal Orientation", Surface and Coatings Technology, vol. 202, Issue 17, May 25, 2008, pp. 4257-4269, https://doi.org/10.1016/j.surfcoat.2008.03.021.

*Primary Examiner* — Archene A Turner
(74) *Attorney, Agent, or Firm* — Studebaker & Brackett PC (57) ABSTRACT

A coated cutting tool comprising a substrate and a coating layer formed on a surface of the substrate, wherein: the coating layer comprises a lower layer, an intermediate layer, and an upper layer in this order from the substrate side; the lower layer comprises one or two or more Ti compound layers containing a Ti compound of Ti and an element of at least one kind selected from the group consisting of C, N, O and B, the intermediate layer comprises an $\alpha$-Al$_2$O$_3$ layer containing $\alpha$-Al$_2$O$_3$, and the upper layer comprises a TiCNO layer containing TiCNO; an average thickness of the coating layer is 5.0 μm or more and 30.0 μm or less; in a specific first cross section, a misorientation A satisfies a specific condition; and in a specific second cross section, a misorientation B satisfies a specific condition.

20 Claims, 1 Drawing Sheet

(51) Int. Cl.
  *C23C 16/36*   (2006.01)
  *C23C 16/32*   (2006.01)
  *C23C 16/34*   (2006.01)
  *C23C 16/38*   (2006.01)
  *C23C 16/40*   (2006.01)

(52) U.S. Cl.
  CPC ............ *C23C 16/34* (2013.01); *C23C 16/36* (2013.01); *C23C 16/38* (2013.01); *C23C 16/403* (2013.01); *B23B 2228/105* (2013.01)

(58) Field of Classification Search
  USPC ......................................................... 429/698
  See application file for complete search history.

(56) References Cited

U.S. PATENT DOCUMENTS

| | | | |
|---|---|---|---|
| 5,766,782 | A | 6/1998 | Ljungberg |
| 5,871,850 | A | 2/1999 | Moriguchi et al. |
| 5,912,051 | A | 6/1999 | Olsson et al. |
| 10,974,324 | B2 * | 4/2021 | Takahashi ............ B23B 27/148 |
| 2003/0022029 | A1 | 1/2003 | Kidama et al. |
| 2004/0202877 | A1 * | 10/2004 | Martensson ............ C04B 41/89 |
| | | | 428/698 |
| 2007/0104945 | A1 | 5/2007 | Ruppi |
| 2010/0330360 | A1 | 12/2010 | Tanibuchi et al. |
| 2014/0193624 | A1 | 7/2014 | Stiens et al. |
| 2014/0377024 | A1 | 12/2014 | Sobana et al. |
| 2017/0008092 | A1 | 1/2017 | Ruppi et al. |
| 2017/0190591 | A1 | 7/2017 | Imamura et al. |
| 2017/0275765 | A1 | 9/2017 | Stiens et al. |
| 2017/0342554 | A1 * | 11/2017 | Bjormander ........... C23C 28/048 |

FOREIGN PATENT DOCUMENTS

| | | | |
|---|---|---|---|
| JP | H08-158052 | A | 6/1996 |
| JP | H08-257808 | A | 10/1996 |
| JP | H08-276305 | A | 10/1996 |
| JP | H09-507528 | A | 7/1997 |
| JP | 2001-107237 | A | 4/2001 |
| JP | 2002-346811 | * | 12/2002 |
| JP | 2005-205586 | A | 8/2005 |
| JP | 2007-125686 | A | 5/2007 |
| JP | 2009-056538 | A | 3/2009 |
| JP | 2012-030308 | A | 2/2012 |
| JP | 2012-196726 | A | 10/2012 |
| JP | 2012-254523 | A | 12/2012 |
| JP | 2013-132717 | A | 7/2013 |
| JP | 2014-530112 | A | 11/2014 |
| JP | 2015-085441 | A | 5/2015 |
| JP | 2017-506163 | A | 3/2017 |
| JP | 2017-530019 | A | 10/2017 |
| TW | 306938 | B | 6/1997 |
| WO | 2017/037796 | A1 | 3/2017 |

* cited by examiner

COATED CUTTING TOOL

TECHNICAL FIELD

The present invention relates to a coated cutting tool.

BACKGROUND ART

It is well known that a conventional coated cutting tool used for the cutting of steel, cast iron, etc., is a coated cutting tool which is obtained by depositing, via chemical vapor deposition, a coating layer with a total thickness of from 3 µm or more to 20 µm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carboxide, a Ti oxycarbonitride, and aluminum oxide ($Al_2O_3$), or consisting of multiple layers of two or more kinds selected therefrom.

JP2013-132717 A discloses a surface-coated cutting tool in which a lower layer composed of a titanium compound layer and an upper layer composed of an aluminum oxide layer ($Al_2O_3$ layer) are formed as hard coating layers by vapor deposition on the surface of a tool substrate constituted by a tungsten carbide-based cemented carbide, wherein the upper layer composed of an aluminum oxide layer ($Al_2O_3$ layer) has a (006) orientation texture coefficient TC(006) of 1.8 or more and a ratio I(104)/I(110) of a peak intensity I(104) of a (104) orientation to a peak intensity I(110) of a (110) orientation of 0.5 to 2.0, and an absolute value of a residual stress value in the aluminum oxide layer ($Al_2O_3$ layer) is 100 MPa or less.

SUMMARY

Technical Problem

An increase in speed, feed and depth of cut has become more conspicuous in cutting in recent times, and the wear resistance of a tool and the fracture resistance thereof are required to be further improved compared to those involved in the prior art. In particular, in recent years, there has been an increase in the number of cutting operations in which a load is applied to a coated cutting tool, such as high-speed cutting of steel, and under such severe cutting conditions, crater wear and fracture occur in the conventional tools due to falling of grains of the coating layer, which makes it impossible to extend the tool life.

The present invention has been made in light of the above circumstances, and an object of the present invention is to provide a coated cutting tool which has excellent wear resistance and fracture resistance and which accordingly allows for an extended tool life.

Solution to Problem

The inventors of the present invention have conducted research on extending the tool life of a coated cutting tool from the above perspective. It has been found that with the below-described configuration in which an $\alpha$-$Al_2O_3$ layer and a TiCNO layer are stacked in this order from the substrate side, the ratio of grains exhibiting a predetermined crystal orientation in respective predetermined regions of the $\alpha$-$Al_2O_3$ layer and the TiCNO layer is equal to or greater than a specific value, and the average thickness of the coating layer is within a predetermined range, the wear resistance can be improved and the fracture resistance can be also improved by suppressing the falling of grains, and as a result, the tool life can be extended. The present invention has been accomplished based on this finding.

Thus, the present invention is as follows.

[1] A coated cutting tool including a substrate and a coating layer formed on a surface of the substrate, wherein:
the coating layer comprises a lower layer, an intermediate layer, and an upper layer in this order from the substrate side;
the lower layer comprises one or two or more Ti compound layers containing a Ti compound of Ti and an element of at least one kind selected from the group consisting of C, N, O and B, the intermediate layer comprises an $\alpha$-$Al_2O_3$ layer containing $\alpha$-$Al_2O_3$, and the upper layer comprises a TiCNO layer containing TiCNO;
an average thickness of the coating layer is 5.0 µm or more and 30.0 µm or less;
in a first cross section parallel to an interface of the substrate on the lower layer side, in a range from the interface of the intermediate layer on the upper layer side up to 1 µm toward the substrate, a misorientation A satisfies a condition represented by a following formula (i); and
in a second cross section parallel to the interface of the substrate on the lower layer side, in a range from the interface of the upper layer on the intermediate layer side up to 1 µm toward the interface on the opposite side thereof, a misorientation B satisfies a condition represented by a following formula (ii):

$$RSA \geq 40 \quad (i)$$

in the formula (i), RSA is a ratio (unit: area %) of a cross-sectional area of grains having a misorientation A of 0 degrees or more to less than 10 degrees to a cross-sectional area of grains having a misorientation A of 0 degrees or more and 45 degrees or less in the first cross section, and the misorientation A is an angle (unit: degree) formed by a normal to the first cross section and a normal to a (001) orientation of a grain of the $\alpha$-$Al_2O_3$ layer in the intermediate layer; and $$RSB \geq 40 \quad (ii)$$

in the formula (ii), RSB is a ratio (unit: area %) of a cross-sectional area of grains having the misorientation B of 0 degrees or more to less than 10 degrees to a cross-sectional area of grains having a misorientation A of 0 degrees or more and 45 degrees or less in the second cross section, and the misorientation B is an angle (unit: degree) formed by a normal to the second cross section and a normal to a (111) orientation of a grain of the TiCNO layer in the upper layer.

[2] The coated cutting tool according to [1], wherein the RSA is 50 area % or more.

[3] The coated cutting tool according to [1] or [2], wherein the RSB is 50 area % or more.

[4] The coated cutting tool according to any one of [1] to [3], wherein
the upper layer is composed of a TiCNO layer containing a compound having a composition represented by a following formula (1):

$$Ti(C_{1-x-y}N_xO_y) \quad (1)$$

wherein x denotes an atomic ratio of N element based on a total of C element, N element and O element, y denotes an atomic ratio of O element based on the total of C element, N element and O element, and $0.15 \leq x \leq 0.65$ and $0.01 \leq y \leq 0.20$.

[5] The coated cutting tool according to any one of [1] to [4], wherein an average thickness of the upper layer is 1.0 μm or more and 6.0 μm or less.

[6] The coated cutting tool according to any one of [1] to [5], wherein an average thickness of the intermediate layer is 3.0 μm or more and 15.0 μm or less.

[7] The coated cutting tool according to any one of [1] to [6], wherein an average thickness of the lower layer is 3.0 μm or more and 15.0 μm or less.

[8] The coated cutting tool according to any one of [1] to [7], wherein the Ti compound constituting the Ti compound layer is at least one selected from the group consisting of TiN, TiC, TiCN, TiCNO, TiON, and $TiB_2$.

[9] The coated cutting tool according to any one of [1] to [8], wherein the substrate is any one of a cemented carbide, a cermet, a ceramic, or a cubic boron nitride sintered body.

Advantageous Effects of Invention

The present invention has been accomplished to solve this problem, and can provide a coated cutting tool that has excellent wear resistance and fracture resistance, thereby making it possible to extend the tool life.

DESCRIPTION OF EMBODIMENTS

Figure 1:
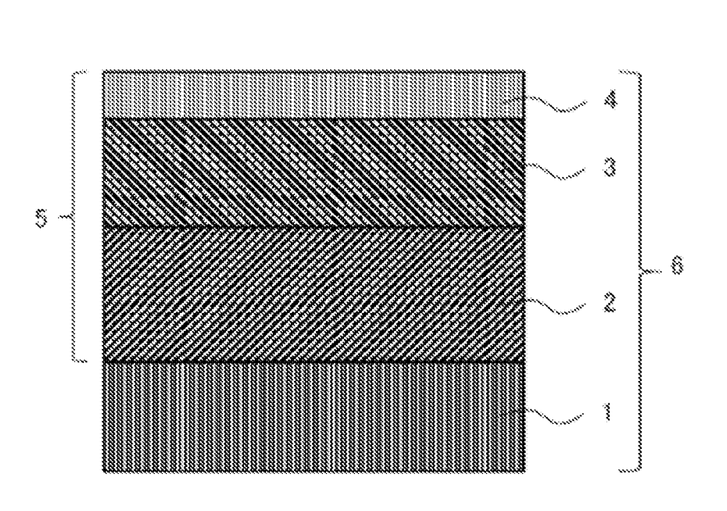
The FIGURE is a schematic cross-sectional view showing an example of a coated cutting tool according to the present invention.

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. In the drawings, unless otherwise specified, positional relationships, such as vertical and horizontal relationships, are based on the positional relationships shown in the drawings. Further, the dimensional ratios of the drawings are not limited to those shown therein.

The coated cutting tool of the present embodiment includes a substrate and a coating layer formed on a surface of the substrate. The coating layer includes a lower layer, an intermediate layer, and an upper layer in this order from the substrate side. The lower layer includes one or two or more Ti compound layers that contains a Ti compound of Ti and an element of at least one kind selected from the group consisting of C, N, O and B. The intermediate layer includes an α-$Al_2O_3$ layer that contains α-$Al_2O_3$, and the upper layer includes a TiCNO layer that contains TiCNO. An average thickness of the coating layer being 5.0 μm or more and 30.0 μm or less. In a first cross section parallel to an interface of the substrate on the lower layer side, in a range from the interface of the intermediate layer on the upper layer side up to 1 μm toward the substrate, a misorientation A satisfies a condition represented by a following formula (i); and in a second cross section parallel to the interface of the substrate on the lower layer side, in a range from the interface of the upper layer on the intermediate layer side up to 1 μm toward the interface on the opposite side thereof, a misorientation B satisfies a condition represented by a following formula (ii):

$$RSA \geq 40 \qquad (i)$$

in the formula (i), RSA is a ratio (unit: area %) of a cross-sectional area of grains having a misorientation A of 0 degrees or more to less than 10 degrees to a cross-sectional area of grains having a misorientation A of 0 degrees or more and 45 degrees or less in the first cross section, and the misorientation A is an angle (unit: degree) formed by a normal to the first cross section and a normal to a (001) orientation of a grain of the α-$Al_2O_3$ layer in the intermediate layer); and $$RSB \geq 40 \qquad (ii)$$

in the formula (ii), RSB is a ratio (unit: area %) of a cross-sectional area of grains having the misorientation B of 0 degrees or more to less than 10 degrees to a cross-sectional area of grains having a misorientation A of 0 degrees or more and 45 degrees or less in the second cross section, and the misorientation B is an angle (unit: degree) formed by a normal to the second cross section and a normal to a (111) orientation of a grain of the TiCNO layer in the upper layer.

The coated cutting tool of the present embodiment comprises the above-described configurations, and this allows the wear resistance and fracture resistance of the coated cutting tool to be improved; as a result, the tool life thereof can be extended. The factors for the improvements in wear resistance and fracture resistance of the coated cutting tool of the present embodiment can be considered to be set forth as follows. However, the present invention is not in any way limited by the factors set forth below. In other words, firstly, in the coated cutting tool of the present embodiment, since the average thickness of the coating layer is 5.0 μm or more, the wear resistance is improved, and since the average thickness of the coating layer is 30.0 μm or less, the adhesion of the coating layer to the substrate and the fracture resistance are improved. The intermediate layer of the coating layer used in the present embodiment has an α-$Al_2O_3$ layer, and the α-$Al_2O_3$ layer has preferential orientation of a (001) orientation so as to satisfy the above formula (i). Where the coated cutting tool of the present embodiment has such an α-$Al_2O_3$ layer having preferential orientation of a (001) orientation, the cutting tool has excellent resistance to crater wear mainly due to excellent heat resistance, and therefore excels in wear resistance. However, since the intermediate layer including the α-$Al_2O_3$ layer having preferential orientation of a (001) orientation is inferior in terms of adhesion, falling of grains may occur under cutting conditions in which a load acts on the coated cutting tool. Accordingly, the coated cutting tool of the present embodiment has an upper layer including a TiCNO layer having preferential orientation of a (111) orientation, so as to satisfy the formula (ii), on the surface of the intermediate layer having the α-$Al_2O_3$ layer, thereby making it possible to suppress the falling of grains of the α-$Al_2O_3$ layer mainly due to good adhesion between the TiCNO layer and the α-$Al_2O_3$ layer. As a result, the wear resistance and fracture resistance are improved. Further, in the coated cutting tool of the present embodiment, since the upper layer also contains oxygen "0", the adhesion with the α-$Al_2O_3$ layer is improved, and further, the oxidation resistance is improved. The combining of the above configurations allows for the coated cutting tool of the present embodiment to have improved wear resistance and fracture resistance, and accordingly, it can be considered that the tool life can be extended.

The FIGURE is a schematic cross-sectional view showing an example of the coated cutting tool of the present embodiment. A coated cutting tool 6 is provided with a substrate 1 and a coating layer 5 located on a surface of the substrate 1, and a lower layer 2, an intermediate layer 3 and an upper layer 4 are laminated in this order from the substrate side in an upward direction in the coating layer 5.

The coated cutting tool according to the present embodiment comprises a substrate and a coating layer formed on a surface of the substrate. Specific examples of types of the coated cutting tool include an indexable cutting insert for milling or turning, a drill and an end mill.

The substrate used in the present embodiment is not particularly limited, as long as it may be used as a substrate for a coated cutting tool. Examples of such substrate include a cemented carbide, cermet, ceramic, a cubic boron nitride sintered body, a diamond sintered body and high-speed steel. From among the above examples, the substrate is preferably comprised of a cemented carbide, cermet, ceramic or a cubic boron nitride sintered body as this provides further excellent wear resistance and fracture resistance, and, from the same perspective, the substrate is more preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided even if the substrate surface has been modified in this way.

The average thickness of the coating layer used in the present embodiment is 5.0 μm or more and 30.0 μm or less. In the coated cutting tool of the present embodiment, where the average thickness of the coating layer is 5.0 μm or more, the wear resistance is improved, and where the average thickness of the coating layer is 30.0 μm or less, the adhesion of the coating layer with the substrate and the fracture resistance are improved. From the same viewpoint, the average thickness of the coating layer is more preferably 10.0 μm or more and 27.0 μm or less, and even more preferably 14.8 μm or more and 25.4 μm or less. It should be noted that, as to the average thickness of each layer and the average thickness of the entire coating layer in the coated cutting tool of the present embodiment, each of such average thicknesses can be obtained by: measuring the thickness of each layer or the thickness of the entire coating layer from each of the cross-sectional surfaces at three or more locations in each layer or in the entire coating layer; and then calculating the arithmetic mean of the resulting measurements.

Lower Layer

The lower layer used in the present embodiment includes one or two or more Ti compound layers composed of a Ti compound of Ti and an element of at least one kind selected from the group consisting of C, N, O and B. When the coated cutting tool includes the lower layer between the substrate and the intermediate layer including the α-Al$_2$O$_3$ layer, the wear resistance and adhesion are improved.

Examples of the Ti compound layers include a TiC layer containing TiC, a TiN layer containing TiN, a TiCN layer containing TiCN, a TiCO layer containing TiCO, a TiCNO layer containing TiCNO, a TiON layer containing TiON and a TiB$_2$ layer containing TiB$_2$.

The lower layer may be constituted by a single layer or multiple layers (for example, two or three layers). However, the lower layer is preferably constituted by multiple layers, is more preferably constituted by two or three layers, and is further preferably constituted by three layers. From the perspective of further improving the wear resistance and adhesion, the Ti compound constituting the Ti compound layer included in the lower layer is preferably at least one selected from the group consisting of TiN, TiC, TiCN, TiCNO, TiON and TiB$_2$. In addition, it is preferable that at least one of the lower layers be a TiCN layer because the wear resistance is further improved. When the lower layer is constituted by three layers: a TiC layer or a TiN layer, serving as a first layer, may be formed on a surface of the substrate; a TiCN layer, serving as a second layer, may be formed on a surface of the first layer; and a TiCNO layer or a TiCO layer, serving as a third layer, may be formed on a surface of the second layer. In particular, as to the lower layer: a TiN layer, serving as a first layer, may be formed on a surface of the substrate; a TiCN layer, serving as a second layer, may be formed on a surface of the first layer; and a TiCNO layer, serving as a third layer, may be formed on a surface of the second layer.

The average thickness of the lower layer used in the present embodiment is preferably 3.0 μm or more and 15.0 μm or less. The coated cutting tool of the present embodiment has improved wear resistance because the average thickness of the lower layer is 3.0 μm or more. Meanwhile, in the coated cutting tool of the present embodiment, since the average thickness of the lower layer is 15.0 μm or less, the fracture resistance is improved mainly due to the suppression of peeling of the coating layer. From the same viewpoint, the average thickness of the lower layer is more preferably 3.5 μm or more and 13.0 μm or less, still more preferably 4.0 μm or more and 12.5 μm or less, and particularly preferably 4.9 μm or more and 12.4 μm or less.

From the viewpoint of further improving the wear resistance and fracture resistance, the average thickness of the TiC layer or TiN layer is preferably 0.05 μm or more and 1.0 μm or less. From the same viewpoint, the average thickness of the TiC layer or TiN layer is more preferably 0.10 μm or more and 0.5 μm or less, and even more preferably 0.15 μm or more and 0.3 μm or less.

From the viewpoint of further improving the wear resistance and fracture resistance, the average thickness of the TiCN layer is preferably 2.0 μm or more and 20.0 μm or less. From the same viewpoint, the average thickness of the TiCN layer is more preferably 2.5 μm or more and 15.0 μm or less, and even more preferably 3.0 μm or more and 12.0 μm or less.

From the viewpoint of further improving wear resistance and fracture resistance, the average thickness of the TiCNO layer or TiCO layer is preferably 0.1 μm or more and 1.0 μm or less. From the same viewpoint, the average thickness of the TiCNO layer or the TiCO layer is more preferably 0.2 μm or more and 0.5 μm or less.

The Ti compound layer is composed of a Ti compound of Ti and an element of at least one kind selected from the group consisting of C, N, O and B. However, such Ti compound layer may contain a very small amount of components other than the above elements, as long as it provides the operation and effects of the lower layer.

Intermediate Layer

The intermediate layer used in the present embodiment includes an α-Al$_2$O$_3$ layer containing α-Al$_2$O$_3$. In the intermediate layer used in the present embodiment, in a first cross section parallel to the interface of the substrate on the lower layer side, in a range from the interface of the intermediate layer on the upper layer side up to 1 μm toward the substrate, a misorientation A satisfies a condition represented by a following formula (i):

$$RSA \geq 40 \qquad (i)$$

(in the formula (i), RSA is a ratio (unit: area %) of a cross-sectional area of grains having a misorientation A of 0 degrees or more to less than 10 degrees to a cross-sectional area of grains having a misorientation A of 0 degrees or more and 45 degrees or less in the first cross section, and the misorientation A is an angle (unit: degree) formed by a normal to the first cross section and a normal to a (001) orientation of a grain of the α-Al$_2$O$_3$ layer in the intermediate layer).

Since the coated cutting tool of the present embodiment has excellent crater wear resistance as a result of the RSA being 40 area % or more, the wear resistance can be improved. From the same viewpoint, the RSA is preferably 50 area % or more (for example, 50 area % or more and 80 area % or less), and more preferably 60 area % or more.

RSA can be determined by the following method. In a first cross section parallel to the interface of the substrate on the lower layer side, in a range from the interface of the intermediate layer on the upper layer side up to 1 μm toward the substrate, the sum (RSA$_{Total}$) of the areas of the cross sections of grains having a misorientation A of the angle formed between the normal to the first cross section and the normal to the (001) orientation of the grains of the α-Al$_2$O$_3$ layer in the intermediate layer of 0 degrees or more and 45 degrees or less is taken as 100 area %, a ratio (area %) of the sum of the cross-sectional areas of grains having a misorientation A of 0 degrees or more and less than 10 degrees to the RSA$_{Total}$ is determined and this ratio may be taken as the RSA. When obtaining the RSA (area %), the cross-sectional area of each grain can be measured using, for example, an electron backscatter diffraction pattern apparatus (EBSD) incorporated in a scanning electron microscope (SEM), a field emission scanning electron microscope (FE-SEM) or the like. With the EBSD, the crystal orientation of each crystal of the grains is determined, the cross-sectional area of the grain with specified crystal orientation is classified into one of the divisions in, for example, respective 5-degree pitches, and the cross-sectional areas of the grains in each division are obtained. Thereafter, for example, a sum of the cross-sectional areas of grains is obtained for the following divisions: a division of 0 degrees or more and less than 10 degrees, a division of 10 degrees or more and less than 20 degrees, a division of 20 degrees or more and less than 30 degrees, and a division of 30 degrees or more to 45 degrees or less. In this case, a sum of the areas of the cross sections of the grains with 0 degrees or more and 45 degrees or less is taken as 100 area %. Then, a ratio of the cross-sectional areas of grains in each of the divisions to the sum RSA$_{Total}$ (100 area %) may be obtained, and the resulting ratio may be taken as RSA. It would be noted that the condition represented by the formula (i) does not necessarily have to be satisfied in the entire range from the interface of the intermediate layer on the upper layer side up to 1 μm toward the substrate side, and may be satisfied with respect to any cross section within the above range.

More specifically, the following method can be used. First, a sample is set in the FE-SEM. The sample is irradiated with an electron beam with an acceleration voltage of 15 kV and an irradiation current of 1.0 nA at an incident angle of 70 degrees. For a measurement range of 30 μm×50 μm, it is preferable to determine the misorientation of the grain cross section present in this range by setting the EBSD to a step size of 0.1 μm.

The average thickness of the intermediate layer used in the present embodiment is preferably 3.0 μm or more and 15.0 μm or less. Where the average thickness of the intermediate layer is 3.0 μm or more, the crater wear resistance on the rake face of the coated cutting tool tends to be further improved, and where the average thickness of the intermediate layer is 15.0 μm or less, the peeling of the coating layer is further suppressed, and the fracture resistance of the coated cutting tool tends to be further improved. From the same viewpoint, the average thickness of the intermediate layer is more preferably 3.0 μm or more and 12.0 μm or less, and even more preferably 3.0 μm or more and 10.0 μm or less.

The intermediate layer only needs to have a layer containing α-aluminum oxide (α-Al$_2$O$_3$), and may or may not contain components other than α-aluminum oxide (α-Al$_2$O$_3$) as long as it provides the operation and effects of the present invention.

Upper Layer

The upper layer used in the present embodiment includes a TiCNO layer containing TiCNO. In the upper layer used in the present embodiment, in a second cross section parallel to the interface of the substrate on the lower layer side, in a range from the interface of the upper layer on the intermediate layer side up to 1 μm toward the interface on the opposite side thereof, the misorientation B satisfies a condition represented by a following formula (ii):

$$RSB \geq 40 \qquad (ii)$$

(in the formula (ii), RSB is a ratio (unit: area %) of a cross-sectional area of grains having the misorientation B of 0 degrees or more to less than 10 degrees to a cross-sectional area of grains having the misorientation B of 0 degrees or more and 45 degrees or less in the second cross section, and the misorientation B is an angle (unit: degree) formed by a normal to the second cross section and a normal to a (111) orientation of a grain of the TiCNO layer in the upper layer.)

Since the coated cutting tool of the present embodiment has an RSB of 40 area % or more, it is possible to prevent the falling of grains of the α-Al$_2$O$_3$ layer, so that the wear resistance and fracture resistance are improved. From the same viewpoint, the RSB is preferably 50 area % or more (for example, 50 area % or more and 75 area % or less).

RSB can be determined by the following method. In a second cross section parallel to the interface of the substrate on the lower layer side, in a range from the interface of the upper layer on the intermediate layer side up to 1 μm toward the interface on the opposite side thereof, the sum (RSB$_{Total}$) of the areas of the cross sections of the grains having a misorientation B of the angle formed between the normal to the second cross section and the normal to the (111) orientation of the grain of the TiCNO layer in the upper layer of 0 degrees or more and 45 degrees or less is taken as 100 area %, a ratio (area %) of the sum of the areas of the cross sections of the grains having the misorientation B of 0 degrees or more and less than 10 degrees to the RSB$_{Total}$ may be determined and this ratio may be taken as the RSB.

When obtaining the RSB (area %), the cross-sectional area of each grain can be measured using, for example, an electron backscatter diffraction pattern apparatus (EBSD) incorporated in a scanning electron microscope (SEM), a field emission scanning electron microscope (FE-SEM) or the like. With the EBSD, the crystal orientation of each crystal of the grains is determined, the cross-sectional area of the grain with specified crystal orientation is classified into one of the divisions in, for example, respective 5-degree pitches, and the cross-sectional areas of the grains in each division are obtained. Thereafter, for example, a sum of the cross-sectional areas of grains is obtained for the following divisions: a division of 0 degrees or more and less than 10 degrees, a division of 10 degrees or more and less than 20 degrees, a division of 20 degrees or more and less than 30 degrees, and a division of 30 degrees or more to 45 degrees or less. In this case, the sum of the areas of the cross sections of the grains with 0 degrees or more and 45 degrees or less is taken as 100 area %. Then, a ratio of the cross-sectional areas of grains in each of the divisions to the sum $RSB_{Total}$ (100 area %) may be obtained, and the resulting ratio may be taken as RSB. The condition represented by the formula (ii) does not necessarily have to be satisfied in the entire range from the interface of the upper layer on the intermediate layer side up to 1 μm toward the interface on the opposite side thereof, and may be satisfied in any cross section within the above range.

More specifically, the following method can be used. First, a sample is set in the FE-SEM. The sample is irradiated with an electron beam with an acceleration voltage of 15 kV and an irradiation current of 1.0 nA at an incident angle of 70 degrees. For a measurement range of 30 μm×50 μm, it is preferable to determine the misorientation of the grain cross section present in this range by setting the EBSD to a step size of 0.1 μm.

The average thickness of the upper layer used in the present embodiment is preferably 1.0 μm or more and 6.0 μm or less. Where the average thickness is 1.0 μm or more, the effect of suppressing the falling of grains of the α-$Al_2O_3$ layer tends to be further improved, and where the average thickness of the upper layer is 6.0 μm or less, the fracture resistance tends to be further improved. From the same viewpoint, the average thickness of the upper layer is more preferably 1.5 μm or more and 5.0 μm or less.

The upper layer used in the present embodiment is preferably composed of a TiCNO layer containing a compound having a composition represented by the following formula (1).

$$Ti(C_{1-x-y}N_xO_y) \qquad (1)$$

(wherein x denotes an atomic ratio of N element based on a total of C element, N element and O element, y denotes an atomic ratio of O element based on the total of C element, N element and O element, and 0.15≤x≤0.65 and 0.01≤y≤0.20).

In the coated cutting tool of the present embodiment, in the compound having the composition represented by the above formula (1), where x is 0.15 or more, the toughness is improved, and thus the fracture resistance tends to be further improved. Meanwhile, where x is 0.65 or less, the content of C and O is relatively high, so the hardness is increased and reactive wear can be suppressed. Therefore, the wear resistance and oxidation resistance tend to be further improved. From the same viewpoint, x in the formula (1) is more preferably 0.18 or more and 0.50 or less, and even more preferably 0.20 or more and 0.40 or less. Moreover, in the coated cutting tool of the present embodiment, where y is 0.01 or more in the compound having the composition represented by the above formula (1), the reaction wear can be suppressed, so the oxidation resistance tends to be further improved. Meanwhile, where y is 0.20 or less, the contents of C and N are relatively high, so the hardness is increased and the toughness is improved. Therefore, wear resistance and fracture resistance tend to be further improved. From the same viewpoint, y in the above formula (1) is more preferably 0.02 or more and 0.18 or less, and even more preferably 0.03 or more and 0.15 or less.

The upper layer only needs to have a layer containing TiCNO, and may or may not contain components other than TiCNO as long as it provides the operation and effects of the present invention.

Outer Layer

The coating layer used in the present embodiment may include an outer layer on the side of the upper layer opposite to the substrate (that is, the surface of the upper layer). The outer layer is preferably a layer of a compound composed of an element of at least one kind selected from the group consisting of Ti, Zr, Hf, V, Nb, Ta, Cr, Mo, W, Al, Si and Y, and an element of at least one kind selected from the group consisting of C, N, O and B (preferably N element) because the wear resistance is further improved. From the same viewpoint, the outer layer is more preferably a layer of a compound composed of an element of at least one kind selected from the group consisting of Ti, Nb, Cr, Al and Si and an element of at least one kind selected from the group consisting of C, N, O and B (preferably N element), even more preferably a layer of a compound composed of an element of at least one kind selected from the group consisting of Ti, Cr, Al and Si and N, and particularly preferably a TiN layer composed of TiN. The outer layer may be a single layer or a multilayer configuration including two or more layers.

In the present embodiment, an average thickness of the outer layer is preferably 0.1 μm or more and 1.0 μm or less. Where the average thickness of the outer layer is within the above range, the wear resistance tends to be further improved. From the same viewpoint, the average thickness of the outer layer is more preferably 0.1 μm or more and 0.5 μm or less.

Method for Forming Coating Layer

For example, the following methods can be used for forming the layers constituting the coating layer in the coated cutting tool of the present embodiment. However, the method of forming such layers is not limited thereto.

For instance, a Ti compound layer, being comprised of a Ti nitride layer (hereinafter also referred to as a "TiN layer"), can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 850° C. or higher to 950° C. or lower, and a pressure of from 300 hPa or higher to 400 hPa or lower.

A Ti compound layer, being comprised of a Ti carbide layer (hereinafter also referred to as a "TiC layer"), can be formed by chemical vapor deposition with a raw material composition of $TiCl_4$: from 1.5 mol % or more to 3.5 mol % or less, $CH_4$: from 3.5 mol % or more to 5.5 mol % or less, and $H_2$: the balance, a temperature of from 950° C. or higher to 1,050° C. or lower, and a pressure of from 70 hPa or higher to 80 hPa or lower.

A Ti compound layer, being comprised of a Ti carbonitride layer (hereinafter also referred to as "TiCN layer"), can be formed by chemical vapor deposition with a raw material composition of $TiCl_4$: from 5.0 mol % or more to 7.0 mol % or less, $CH_3CN$: from 0.5 mol % or more to 1.5 mol % or less, and $H_2$: the balance, a temperature of from 800° C. or higher to 900° C. or lower and a pressure of from 60 hPa or higher to 80 hPa or lower.

A Ti compound layer, being comprised of a Ti oxycarbonitride layer (hereinafter also referred to as "TiCNO layer") in the lower layer, can be formed by chemical vapor deposition with a raw material composition of $TiCl_4$: from 3.0 mol % or more to 4.0 mol % or less, CO: from 0.5 mol % or more to 1.0 mol % or less, $N_2$: from 30 mol % or more to 40 mol % or less and $H_2$: the balance, a temperature of from 950° C. or higher to 1050° C. or lower and a pressure of from 50 hPa or higher to 150 hPa or lower.

A Ti compound layer, being comprised of a Ti carboxide layer (hereinafter also referred to as a "TiCO layer"), can be formed by chemical vapor deposition with a raw material composition of $TiCl_4$: from 1.0 mol % or more to 2.0 mol % or less, CO: from 2.0 mol % or more to 3.0 mol % or less, and $H_2$: the balance, a temperature of from 950° C. or higher to 1,050° C. or lower, and a pressure of from 50 hPa or higher to 150 hPa or lower.

An intermediate layer, being comprised of an $\alpha$-$Al_2O_3$ layer (hereinafter also simply referred to as an "$Al_2O_3$ layer"), can be obtained by, for example, the method set forth below.

Firstly, a lower layer, being comprised of one or more Ti compound layers, is formed on a surface of a substrate. Next, from among such layers, a surface of a layer which is most distant from the substrate is oxidized. Thereafter, nuclei of the $\alpha$-$Al_2O_3$ layer are formed on the surface of the layer which is most distant from the substrate, and the $\alpha$-$Al_2O_3$ layer is formed after the nuclei have been formed.

More specifically, the oxidation of the surface of the layer which is most distant from the substrate is performed under the conditions of the raw material composition of CO: from 0.1 mol % or more to 0.3 mol % or less, $CO_2$: from 0.3 mol % or more to 1.0 mol % or less, $H_2$: the balance, a temperature of from 950° C. or higher to 1050° C. or lower and a pressure of from 50 hPa or higher to 60 hPa or lower (oxidation step). The oxidation treatment time in this case is preferably 1 min to 3 min.

Thereafter, nuclei of the $\alpha$-$Al_2O_3$ layer are formed by chemical vapor deposition with a raw material composition of $AlCl_3$: from 1.0 mol % or more to 4.0 mol % or less, CO: from 0.05 mol % or more to 2.0 mol % or less, $CO_2$: from 1.0 mol % or more to 3.0 mol % or less, HCl: from 2.0 mol % or more to 3.0 mol % or less, and $H_2$: the balance, a temperature of from 880° C. or higher to 930° C. or lower and a pressure of from 60 hPa or higher to 80 hPa or lower (nucleation step).

Then, the $\alpha$-$Al_2O_3$ layer is formed by chemical vapor deposition with a raw material composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.15 mol % or more to 0.25 mol % or less, and $H_2$: the balance, a temperature of from 950° C. or higher to 1000° C. or lower and a pressure of from 60 hPa or higher to 80 hPa or lower (film formation step).

In order to set the RSA (area %) to a specific value or more, the oxidation treatment time in the oxidation step may be controlled, the ratio of CO in the gas composition in the oxidation step and/or nucleation step may be controlled, or the film formation temperature in the film formation step may be controlled. More specifically, the RSA can be increased by increasing the ratio (area %) of grains having an angular misorientation A within a specific range by increasing the oxidation treatment time in the oxidation step, increasing the ratio of CO in the gas composition in the oxidation step and/or nucleation step, or making the film formation temperature in the film formation step higher than the nucleation temperature in the nucleation step.

An upper layer composed of a Ti oxycarbonitride layer (hereinafter also referred to as "TiCNO layer") is then formed on the surface of the $\alpha$-$Al_2O_3$ layer.

The TiCNO layer can be formed by chemical vapor deposition with a raw material composition of $TiCl_4$: from 4.0 mol % or more to 8.0 mol % or less, $CH_3CN$: from 0.8 mol % or more to 2.5 mol % or less, $C_2H_4$: from 0 mol % or more to 2.0 mol % or less, CO: from 1.2 mol % or more to 3.5 mol % or less, $N_2$: from 1.0 mol % or more to 25.0 mol % or less, and $H_2$: the balance, a temperature of from 950° C. or higher to 1050° C. or lower and a pressure of from 60 hPa or higher to 80 hPa or lower (upper layer formation step).

In order to set the RSB (area %) to a specific value or more, the temperature may be controlled or the ratio of $CH_3CN$ in the raw material composition may be controlled in the upper layer formation step. More specifically, the RSB (area %) can be increased by increasing the temperature or increasing the ratio of $CH_3CN$ in the raw material composition in the upper layer formation step.

Further, in order to control the composition represented by the formula (1), the raw material composition may be appropriately adjusted. More specifically, for example, in order to increase the ratio of carbon (C) in the composition represented by the formula (1), a method of increasing the ratio of CO in the raw material composition can be mentioned.

The thickness of each layer in the coating layer of the coated cutting tool of the present embodiment can be measured by observing a cross-sectional structure of the coated cutting tool, using an optical microscope, a scanning electron microscope (SEM), a FE-SEM, or the like. It should be noted that, as to the average thickness of each layer in the coated cutting tool of the present embodiment, such average thickness can be obtained by: measuring the thickness of each layer at three or more locations near the position 50 μm from the edge, toward the center of the rake surface of the coated cutting tool; and calculating the arithmetic mean of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS), or the like.

EXAMPLES

Hereinafter, the present invention will be described in greater detail with reference to examples, but the present invention is not limited to these examples.

As a substrate, a cutting insert made of a cemented carbide having a composition of 88.9WC-7.9Co-1.5TiN-1.4NbC-0.3$Cr_3C_2$ (the above numbers are mass %) and an insert shape of CNMG120412, a cutting insert made of a cemented carbide having a composition of 89.7WC-7.1Co-1.5TiN-1.5NbC-0.2$Cr_3C_2$ (the above numbers are mass %) and an insert shape of CNMG120412 were prepared. The edges of these substrates were subjected to round honing by means of an SiC brush, and surfaces of the substrates were then washed.

Invention Samples 1 to 17 and Comparative Samples 1 to 9

After the substrate surface was washed, a coating layer was formed by chemical vapor deposition. Firstly, the substrate was inserted into an external heating chemical vapor deposition apparatus, and the first layer having the composition shown in Table 6 was formed under the conditions of the raw material composition, temperature and pressure shown in Table 1 on the surface of the substrate to have the average thickness shown in Table 6. Then, under the conditions of the raw material composition, temperature and pressure shown in Table 1, the second layer having the composition shown in Table 6 was formed on the surface of the first layer to have the average thickness shown in Table 6. Next, under the conditions of the raw material composition, temperature and pressure shown in Table 1, the third layer having the composition shown in Table 6 was formed on the surface of the second layer to have the average thickness shown in Table 6. As a result, a lower layer composed of three layers was formed. Thereafter, the surface of the third layer was oxidized for the time shown in Table 2 under the conditions of composition, temperature and pressure shown in Table 2. Next, under the conditions of the raw material composition, temperature, and pressure shown in Table 3, nuclei of α-aluminum oxide (α-$Al_2O_3$) were formed on the surface of the third layer subjected to the oxidation treatment. Further, under the conditions of the raw material composition, temperature and pressure shown in Table 4, the intermediate layer (α-$Al_2O_3$ layer) having the composition shown in Table 6 was formed on the surface of the third layer and the nuclei of α-aluminum oxide (α-$Al_2O_3$) to have an average thickness shown in Table 6. Next, under the conditions of the raw material composition, temperature and pressure shown in Table 5, the upper layer having the composition shown in Table 6 was formed on the surface of the α-$Al_2O_3$ layer to have the average thickness shown in Table 6. Further, for Invention Samples 1 to 5 and 14 to 17 and Comparative Samples 1, 2 and 9, under the conditions of the raw material composition, temperature and pressure shown in Table 2, the outer layer having the composition shown in Table 6 was formed on the surface of the upper layer to have the average thickness shown in Table 6. In this way, coated cutting tools of Invention Samples 1 to 17 and Comparative Samples 1 to 9 were obtained.

The thickness of each of the layers of each of the obtained samples was obtained as set forth below. That is, using an FE-SEM, such average thickness was obtained by: measuring the thickness of each layer at each of the three locations from the cross-sectional surface near the position 50 μm from the edge of the coated cutting tool, toward the center of the rake surface thereof; and calculating the arithmetic mean of the resulting measurements. The composition of each layer of the obtained samples was measured using EDS in a cross section in the vicinity of the position from the edge of the coated cutting tool to 50 μm toward the center of the rake face.

TABLE 1

| | Composition of each layer | Temperature (° C.) | Pressure (hPa) | Raw material composition (mol %) |
|---|---|---|---|---|
| Lower layer | TiN | 900 | 350 | $TiCl_4$: 7.5%, $N_2$: 40.0%, $H_2$: 52.5% |
| | TiC | 1000 | 75 | $TiCl_4$: 2.4%, $CH_4$: 4.6%, $H_2$: 93.0% |
| | TiCN | 850 | 70 | $TiCl_4$: 6.0%, $CH_3CN$: 1.0%, $H_2$: 93.0% |
| | TiCNO | 1000 | 100 | $TiCl_4$: 3.5%, CO: 0.7%, $N_2$: 35.5%, $H_2$: 60.3% |
| | TiCO | 1000 | 80 | $TiCl_4$: 1.5%, CO: 2.5%, $H_2$: 96.0% |
| Outer layer | TiN | 1000 | 350 | $TiCl_4$: 7.5%, $N_2$: 40.0%, $H_2$: 52.5% |

TABLE 2

| | Oxidation treatment | | | | | |
|---|---|---|---|---|---|---|
| | Temperature (° C.) | Pressure (hPa) | Raw material composition (mol %) | | | Time (min) |
| | | | CO | $CO_2$ | $H_2$ | |
| Invention Sample 1 | 1000 | 55 | 0.3 | 0.5 | 99.2 | 2 |
| Invention Sample 2 | 1000 | 55 | 0.1 | 0.5 | 99.4 | 2 |
| Invention Sample 3 | 1000 | 55 | 0.3 | 0.5 | 99.2 | 3 |
| Invention Sample 4 | 1000 | 55 | 0.3 | 0.5 | 99.2 | 2 |
| Invention Sample 5 | 1000 | 55 | 0.3 | 0.5 | 99.2 | 2 |
| Invention Sample 6 | 1000 | 55 | 0.3 | 0.5 | 99.2 | 2 |
| Invention Sample 7 | 1000 | 55 | 0.3 | 0.5 | 99.2 | 2 |
| Invention Sample 8 | 1000 | 55 | 0.3 | 0.5 | 99.2 | 2 |
| Invention Sample 9 | 1000 | 55 | 0.3 | 0.5 | 99.2 | 2 |
| Invention Sample 10 | 1000 | 55 | 0.3 | 0.5 | 99.2 | 2 |
| Invention Sample 11 | 1000 | 55 | 0.3 | 0.5 | 99.2 | 2 |
| Invention Sample 12 | 1000 | 55 | 0.3 | 0.5 | 99.2 | 2 |
| Invention Sample 13 | 1000 | 55 | 0.3 | 0.5 | 99.2 | 2 |
| Invention Sample 14 | 1000 | 55 | 0.3 | 0.5 | 99.2 | 2 |
| Invention Sample 15 | 1000 | 55 | 0.3 | 0.5 | 99.2 | 2 |
| Invention Sample 16 | 1000 | 55 | 0.3 | 0.5 | 99.2 | 2 |
| Invention Sample 17 | 1000 | 55 | 0.3 | 0.5 | 99.2 | 2 |
| Comparative Sample 1 | 1000 | 55 | 0 | 0.5 | 99.5 | 1 |
| Comparative Sample 2 | 1000 | 55 | 0.3 | 0.5 | 99.2 | 2 |
| Comparative Sample 3 | 1000 | 55 | 0.3 | 0.5 | 99.2 | 2 |
| Comparative Sample 4 | 1000 | 55 | 0.3 | 0.5 | 99.2 | 2 |
| Comparative Sample 5 | 1000 | 55 | 0 | 0.5 | 99.5 | 1 |
| Comparative Sample 6 | 1000 | 55 | 0 | 0.5 | 99.5 | 1 |
| Comparative Sample 7 | 1000 | 55 | 0 | 0.5 | 99.5 | 1 |
| Comparative Sample 8 | 1000 | 55 | 0 | 0.5 | 99.5 | 1 |
| Comparative Sample 9 | 1000 | 55 | 0.3 | 0.5 | 99.2 | 2 |

TABLE 3

| | Intermediate layer (nucleation step) | | | | | | |
|---|---|---|---|---|---|---|---|
| | Temperature (° C.) | Pressure (hPa) | Raw material composition (mol %) | | | | |
| | | | $AlCl_3$ | CO | $CO_2$ | HCl | $H_2$ |
| Invention Sample 1 | 900 | 70 | 2.0 | 1.0 | 1.5 | 2.5 | 93.0 |
| Invention Sample 2 | 920 | 70 | 2.5 | 0.5 | 2.0 | 2.5 | 92.5 |
| Invention Sample 3 | 920 | 70 | 2.5 | 1.5 | 2.0 | 2.5 | 91.5 |
| Invention Sample 4 | 900 | 70 | 2.0 | 1.0 | 1.5 | 2.5 | 93.0 |

TABLE 3-continued

Intermediate layer (nucleation step)

| | Temperature (° C.) | Pressure (hPa) | Raw material composition (mol %) | | | | |
|---|---|---|---|---|---|---|---|
| | | | AlCl$_3$ | CO | CO$_2$ | HCl | H$_2$ |
| Invention Sample 5 | 900 | 70 | 2.0 | 1.0 | 1.5 | 2.5 | 93.0 |
| Invention Sample 6 | 900 | 70 | 2.0 | 1.0 | 1.5 | 2.5 | 93.0 |
| Invention Sample 7 | 900 | 70 | 2.0 | 1.0 | 1.5 | 2.5 | 93.0 |
| Invention Sample 8 | 900 | 70 | 2.0 | 1.0 | 1.5 | 2.5 | 93.0 |
| Invention Sample 9 | 900 | 70 | 2.0 | 1.0 | 1.5 | 2.5 | 93.0 |
| Invention Sample 10 | 900 | 70 | 2.0 | 1.0 | 1.5 | 2.5 | 93.0 |
| Invention Sample 11 | 900 | 70 | 2.0 | 1.0 | 1.5 | 2.5 | 93.0 |
| Invention Sample 12 | 900 | 70 | 2.0 | 1.0 | 1.5 | 2.5 | 93.0 |
| Invention Sample 13 | 900 | 70 | 2.0 | 1.0 | 1.5 | 2.5 | 93.0 |
| Invention Sample 14 | 900 | 70 | 2.0 | 1.0 | 1.5 | 2.5 | 93.0 |
| Invention Sample 15 | 900 | 70 | 2.0 | 1.0 | 1.5 | 2.5 | 93.0 |
| Invention Sample 16 | 900 | 70 | 2.0 | 1.0 | 1.5 | 2.5 | 93.0 |
| Invention Sample 17 | 900 | 70 | 2.0 | 1.0 | 1.5 | 2.5 | 93.0 |
| Comparative Sample 1 | 1000 | 70 | 2.5 | 0.0 | 1.0 | 2.5 | 94.0 |
| Comparative Sample 2 | 900 | 70 | 2.0 | 1.0 | 1.5 | 2.5 | 93.0 |
| Comparative Sample 3 | 900 | 70 | 2.0 | 1.0 | 1.5 | 2.5 | 93.0 |
| Comparative Sample 4 | 900 | 70 | 2.0 | 1.0 | 1.5 | 2.5 | 93.0 |
| Comparative Sample 5 | 1000 | 70 | 2.5 | 0.0 | 1.0 | 2.5 | 94.0 |
| Comparative Sample 6 | 1000 | 70 | 2.5 | 0.0 | 1.0 | 2.5 | 94.0 |
| Comparative Sample 7 | 1000 | 70 | 2.5 | 0.0 | 1.0 | 2.5 | 94.0 |
| Comparative Sample 8 | 1000 | 70 | 2.5 | 0.0 | 1.0 | 2.5 | 94.0 |
| Comparative Sample 9 | 900 | 70 | 2.0 | 1.0 | 1.5 | 2.5 | 93.0 |

TABLE 4

Intermediate layer (film formation step)

| | Temperature (° C.) | Pressure (hPa) | Raw material composition (mol %) | | | | |
|---|---|---|---|---|---|---|---|
| | | | AlCl$_3$ | CO$_2$ | HCl | H$_2$S | H$_2$ |
| Invention Sample 1 | 990 | 70 | 3.0 | 3.0 | 2.5 | 0.20 | 91.3 |
| Invention Sample 2 | 990 | 70 | 3.0 | 3.0 | 2.5 | 0.20 | 91.3 |
| Invention Sample 3 | 990 | 70 | 3.0 | 3.0 | 2.5 | 0.20 | 91.3 |
| Invention Sample 4 | 990 | 70 | 3.0 | 3.0 | 2.5 | 0.20 | 91.3 |
| Invention Sample 5 | 990 | 70 | 3.0 | 3.0 | 2.5 | 0.20 | 91.3 |
| Invention Sample 6 | 990 | 70 | 3.0 | 3.0 | 2.5 | 0.20 | 91.3 |
| Invention Sample 7 | 990 | 70 | 3.0 | 3.0 | 2.5 | 0.20 | 91.3 |
| Invention Sample 8 | 990 | 70 | 3.0 | 3.0 | 2.5 | 0.20 | 91.3 |

TABLE 4-continued

Intermediate layer (film formation step)

| | Temperature (° C.) | Pressure (hPa) | Raw material composition (mol %) | | | | |
|---|---|---|---|---|---|---|---|
| | | | AlCl$_3$ | CO$_2$ | HCl | H$_2$S | H$_2$ |
| Invention Sample 9 | 990 | 70 | 3.0 | 3.0 | 2.5 | 0.20 | 91.3 |
| Invention Sample 10 | 990 | 70 | 3.0 | 3.0 | 2.5 | 0.20 | 91.3 |
| Invention Sample 11 | 990 | 70 | 3.0 | 3.0 | 2.5 | 0.20 | 91.3 |
| Invention Sample 12 | 990 | 70 | 3.0 | 3.0 | 2.5 | 0.20 | 91.3 |
| Invention Sample 13 | 990 | 70 | 3.0 | 3.0 | 2.5 | 0.20 | 91.3 |
| Invention Sample 14 | 990 | 70 | 3.0 | 3.0 | 2.5 | 0.20 | 91.3 |
| Invention Sample 15 | 990 | 70 | 3.0 | 3.0 | 2.5 | 0.20 | 91.3 |
| Invention Sample 16 | 990 | 70 | 3.0 | 3.0 | 2.5 | 0.20 | 91.3 |
| Invention Sample 17 | 990 | 70 | 3.0 | 3.0 | 2.5 | 0.20 | 91.3 |
| Comparative Sample 1 | 990 | 70 | 3.0 | 3.0 | 2.5 | 0.20 | 91.3 |
| Comparative Sample 2 | 990 | 70 | 3.0 | 3.0 | 2.5 | 0.20 | 91.3 |
| Comparative Sample 3 | 990 | 70 | 3.0 | 3.0 | 2.5 | 0.20 | 91.3 |
| Comparative Sample 4 | 990 | 70 | 3.0 | 3.0 | 2.5 | 0.20 | 91.3 |
| Comparative Sample 5 | 990 | 70 | 3.0 | 3.0 | 2.5 | 0.20 | 91.3 |
| Comparative Sample 6 | 990 | 70 | 3.0 | 3.0 | 2.5 | 0.20 | 91.3 |
| Comparative Sample 7 | 990 | 70 | 3.0 | 3.0 | 2.5 | 0.20 | 91.3 |
| Comparative Sample 8 | 990 | 70 | 3.0 | 3.0 | 2.5 | 0.20 | 91.3 |
| Comparative Sample 9 | 990 | 70 | 3.0 | 3.0 | 2.5 | 0.20 | 91.3 |

TABLE 5

Upper layer

| | Temperature (° C.) | Pressure (hPa) | Raw material composition (mol %) | | | | | |
|---|---|---|---|---|---|---|---|---|
| | | | TiCl$_4$ | CH$_3$CN | CH$_4$ | C$_2$H$_4$ | CO | N$_2$ | H$_2$ |
| Invention Sample 1 | 1000 | 70 | 6.0 | 1.0 | 0.0 | 0.0 | 1.5 | 5.0 | 86.5 |
| Invention Sample 2 | 1000 | 70 | 6.0 | 1.2 | 0.0 | 0.0 | 1.5 | 5.0 | 86.3 |
| Invention Sample 3 | 1000 | 70 | 6.0 | 0.8 | 0.0 | 0.0 | 1.5 | 5.0 | 86.7 |
| Invention Sample 4 | 950 | 70 | 6.0 | 0.7 | 0.0 | 0.0 | 1.5 | 5.0 | 86.8 |
| Invention Sample 5 | 1050 | 70 | 6.0 | 2.0 | 0.0 | 0.0 | 1.5 | 5.0 | 85.5 |
| Invention Sample 6 | 1000 | 70 | 6.0 | 1.0 | 0.0 | 0.0 | 1.5 | 5.0 | 86.5 |
| Invention Sample 7 | 1000 | 70 | 6.0 | 1.0 | 0.0 | 0.0 | 1.5 | 5.0 | 86.5 |
| Invention Sample 8 | 1000 | 70 | 6.0 | 1.0 | 0.0 | 0.0 | 1.5 | 5.0 | 86.5 |
| Invention Sample 9 | 1000 | 70 | 6.0 | 1.0 | 0.0 | 0.0 | 1.5 | 5.0 | 86.5 |
| Invention Sample 10 | 1000 | 70 | 6.0 | 1.0 | 0.0 | 0.0 | 1.5 | 5.0 | 86.5 |
| Invention Sample 11 | 1000 | 70 | 6.0 | 1.0 | 0.0 | 0.0 | 1.5 | 5.0 | 86.5 |

TABLE 5-continued

| | | | Upper layer | | | | | | |
|---|---|---|---|---|---|---|---|---|---|
| | Temperature (° C.) | Pressure (hPa) | Raw material composition (mol %) | | | | | | |
| | | | TiCl$_4$ | CH$_3$CN | CH$_4$ | C$_2$H$_4$ | CO | N$_2$ | H$_2$ |
| Invention Sample 12 | 1000 | 70 | 6.0 | 1.0 | 0.0 | 0.0 | 1.5 | 5.0 | 86.5 |
| Invention Sample 13 | 1000 | 70 | 6.0 | 1.0 | 0.0 | 0.0 | 1.5 | 5.0 | 86.5 |
| Invention Sample 14 | 1020 | 70 | 6.0 | 0.8 | 0.0 | 0.0 | 2.5 | 20.0 | 70.7 |
| Invention Sample 15 | 1000 | 70 | 6.0 | 1.0 | 0.0 | 0.0 | 3.2 | 5.0 | 84.8 |
| Invention Sample 16 | 1000 | 70 | 6.0 | 0.5 | 0.0 | 1.8 | 1.5 | 3.0 | 87.2 |
| Invention Sample 17 | 1000 | 70 | 6.0 | 1.0 | 0.0 | 0.0 | 0.7 | 5.0 | 87.3 |
| Comparative Sample 1 | 1000 | 70 | 6.0 | 1.0 | 0.0 | 0.0 | 1.5 | 5.0 | 86.5 |
| Comparative Sample 2 | 1000 | 70 | 6.0 | 0.0 | 1.5 | 0.0 | 1.5 | 15.0 | 76.0 |
| Comparative Sample 3 | 1000 | 70 | 6.0 | 1.0 | 0.0 | 0.0 | 1.5 | 5.0 | 86.5 |
| Comparative Sample 4 | 1000 | 350 | 7.5 | 0.0 | 0.0 | 0.0 | 0.0 | 40.0 | 52.5 |
| Comparative Sample 5 | 1000 | 70 | 6.0 | 0.0 | 1.5 | 0.0 | 1.5 | 15.0 | 76.0 |
| Comparative Sample 6 | 1000 | 70 | 6.0 | 0.0 | 1.5 | 0.0 | 1.5 | 15.0 | 76.0 |
| Comparative Sample 7 | 1000 | 70 | 6.0 | 0.0 | 1.5 | 0.0 | 1.5 | 15.0 | 76.0 |
| Comparative Sample 8 | 1000 | 70 | 6.0 | 0.0 | 1.5 | 0.0 | 1.5 | 15.0 | 76.0 |
| Comparative Sample 9 | 1000 | 70 | 6.0 | 1.0 | 1.5 | 0.0 | 3.2 | 15.0 | 73.3 |

TABLE 6

| | Coating layer | | | | | | | | | | | | | |
|---|---|---|---|---|---|---|---|---|---|---|---|---|---|---|
| | Lower layer | | | | | | Intermediate layer | | | Upper layer | | Outer layer | | Thickness of entire coating layer (µm) |
| | First layer | | Second layer | | Third layer | | | | | | | | | |
| Sample Number | Composition | Average thickness (µm) | Composition | Average thickness (µm) | Composition | Average thickness (µm) | Thickness of entire lower layer (µm) | Composition | Crystal system | Average thickness (µm) | Composition | Average thickness (µm) | Composition | Average thickness (µm) | |
| Invention Sample 1 | TiN | 0.2 | TiCN | 5.0 | TiCNO | 0.2 | 5.4 | Al$_2$O$_3$ | α | 8.0 | Ti(C$_{0.55}$N$_{0.40}$O$_{0.05}$) | 3.0 | TiN | 0.2 | 16.6 |
| Invention Sample 2 | TiN | 0.2 | TiCN | 5.0 | TiCNO | 0.2 | 5.4 | Al$_2$O$_3$ | α | 8.0 | Ti(C$_{0.55}$N$_{0.40}$O$_{0.05}$) | 3.0 | TiN | 0.2 | 16.6 |
| Invention Sample 3 | TiN | 0.2 | TiCN | 5.0 | TiCNO | 0.2 | 5.4 | Al$_2$O$_3$ | α | 8.0 | Ti(C$_{0.55}$N$_{0.40}$O$_{0.05}$) | 3.0 | TiN | 0.2 | 16.6 |
| Invention Sample 4 | TiN | 0.2 | TiCN | 5.0 | TiCNO | 0.2 | 5.4 | Al$_2$O$_3$ | α | 8.0 | Ti(C$_{0.55}$N$_{0.40}$O$_{0.05}$) | 3.0 | TiN | 0.2 | 16.6 |
| Invention Sample 5 | TiN | 0.2 | TiCN | 5.0 | TiCNO | 0.2 | 5.4 | Al$_2$O$_3$ | α | 8.0 | Ti(C$_{0.55}$N$_{0.40}$O$_{0.05}$) | 3.0 | TiN | 0.2 | 16.6 |
| Invention Sample 6 | TiN | 0.2 | TiCN | 5.0 | TiCNO | 0.2 | 5.4 | Al$_2$O$_3$ | α | 8.0 | Ti(C$_{0.55}$N$_{0.40}$O$_{0.05}$) | 1.4 | — | | 14.8 |
| Invention Sample 7 | TiN | 0.2 | TiCN | 5.0 | TiCNO | 0.2 | 5.4 | Al$_2$O$_3$ | α | 8.0 | Ti(C$_{0.55}$N$_{0.40}$O$_{0.05}$) | 4.0 | — | | 17.4 |
| Invention Sample 8 | TiN | 0.2 | TiCN | 5.0 | TiCNO | 0.2 | 5.4 | Al$_2$O$_3$ | α | 8.0 | Ti(C$_{0.55}$N$_{0.40}$O$_{0.05}$) | 5.8 | — | | 19.2 |
| Invention Sample 9 | TiN | 0.2 | TiCN | 10.5 | TiCNO | 0.2 | 10.9 | Al$_2$O$_3$ | α | 3.0 | Ti(C$_{0.55}$N$_{0.40}$O$_{0.05}$) | 3.0 | — | | 16.9 |
| Invention Sample 10 | TiC | 0.2 | TiCN | 5.0 | TiCNO | 0.2 | 5.4 | Al$_2$O$_3$ | α | 8.0 | Ti(C$_{0.55}$N$_{0.40}$O$_{0.05}$) | 3.0 | — | | 16.4 |
| Invention Sample 11 | TiN | 0.2 | TiCN | 5.0 | TiCO | 0.2 | 5.4 | Al$_2$O$_3$ | α | 8.0 | Ti(C$_{0.55}$N$_{0.40}$O$_{0.05}$) | 3.0 | — | | 16.4 |
| Invention Sample 12 | TiN | 0.2 | TiCN | 4.5 | TiCNO | 0.2 | 4.9 | Al$_2$O$_3$ | α | 4.5 | Ti(C$_{0.55}$N$_{0.40}$O$_{0.05}$) | 3.0 | — | | 12.4 |
| Invention Sample 13 | TiN | 0.2 | TiCN | 12.0 | TiCNO | 0.2 | 12.4 | Al$_2$O$_3$ | α | 10.0 | Ti(C$_{0.55}$N$_{0.40}$O$_{0.05}$) | 3.0 | — | | 25.4 |
| Invention Sample 14 | TiN | 0.2 | TiCN | 5.0 | TiCNO | 0.2 | 5.4 | Al$_2$O$_3$ | α | 8.0 | Ti(C$_{0.30}$N$_{0.60}$O$_{0.10}$) | 3.0 | TiN | 0.2 | 16.6 |
| Invention Sample 15 | TiN | 0.2 | TiCN | 5.0 | TiCNO | 0.2 | 5.4 | Al$_2$O$_3$ | α | 8.0 | Ti(C$_{0.55}$N$_{0.30}$O$_{0.15}$) | 3.0 | TiN | 0.2 | 16.6 |
| Invention Sample 16 | TiN | 0.2 | TiCN | 5.0 | TiCNO | 0.2 | 5.4 | Al$_2$O$_3$ | α | 8.0 | Ti(C$_{0.75}$N$_{0.20}$O$_{0.05}$) | 3.0 | TiN | 0.2 | 16.6 |
| Invention Sample 17 | TiN | 0.2 | TiCN | 5.0 | TiCNO | 0.2 | 5.4 | Al$_2$O$_3$ | α | 8.0 | Ti(C$_{0.57}$N$_{0.40}$O$_{0.03}$) | 3.0 | TiN | 0.2 | 16.6 |

TABLE 6-continued

| | Coating layer | | | | | | | | | | | | | |
|---|---|---|---|---|---|---|---|---|---|---|---|---|---|---|
| | Lower layer | | | | | | Intermediate layer | | | Upper layer | | Outer layer | | Thick- |
| | First layer | | Second layer | | Third layer | | Thick- | | | | | | | |
| Sample Number | Composition | Average thickness (μm) | Composition | Average thickness (μm) | Composition | Average thickness (μm) | ness of entire lower layer (μm) | Composition | Crystal system | Average thickness (μm) | Composition | Average thickness (μm) | Composition | Average thickness (μm) | ness of entire coating layer (μm) |
| Comparative Sample 1 | TiN | 0.2 | TiCN | 5.0 | TiCNO | 0.2 | 5.4 | $Al_2O_3$ | α | 8.0 | $Ti(C_{0.55}N_{0.40}O_{0.05})$ | 3.0 | TiN | 0.2 | 16.6 |
| Comparative Sample 2 | TiN | 0.2 | TiCN | 5.0 | TiCNO | 0.2 | 5.4 | $Al_2O_3$ | α | 8.0 | $Ti(C_{0.55}N_{0.40}O_{0.05})$ | 3.0 | TiN | 0.2 | 16.6 |
| Comparative Sample 3 | TiN | 0.2 | TiCN | 15.0 | TiCNO | 0.2 | 15.4 | $Al_2O_3$ | α | 15.0 | $Ti(C_{0.55}N_{0.40}O_{0.05})$ | 3.0 | — | | 33.4 |
| Comparative Sample 4 | TiN | 0.2 | TiCN | 5.0 | TiCNO | 0.2 | 5.4 | $Al_2O_3$ | α | 8.0 | TiN | 3.0 | — | | 16.4 |
| Comparative Sample 5 | TiN | 0.2 | TiCN | 5.0 | TiCNO | 0.2 | 5.4 | $Al_2O_3$ | α | 8.0 | $Ti(C_{0.55}N_{0.40}O_{0.05})$ | 3.0 | — | | 16.4 |
| Comparative Sample 6 | TiN | 0.2 | TiCN | 5.0 | TiCNO | 0.2 | 5.4 | $Al_2O_3$ | α | 8.0 | $Ti(C_{0.55}N_{0.40}O_{0.05})$ | 4.0 | — | | 17.4 |
| Comparative Sample 7 | TiN | 0.2 | TiCN | 10.5 | TiCNO | 0.2 | 10.9 | $Al_2O_3$ | α | 2.5 | $Ti(C_{0.55}N_{0.40}O_{0.05})$ | 3.0 | — | | 16.4 |
| Comparative Sample 8 | TiN | 0.2 | TiCN | 4.5 | TiCNO | 0.2 | 4.9 | $Al_2O_3$ | α | 4.5 | $Ti(C_{0.55}N_{0.40}O_{0.05})$ | 3.0 | — | | 12.4 |
| Comparative Sample 9 | TiN | 0.2 | TiCN | 5.0 | TiCNO | 0.2 | 5.4 | $Al_2O_3$ | α | 8.0 | $Ti(C_{0.55}N_{0.40}O_{0.05})$ | 3.0 | TiN | 0.2 | 16.6 |

* "—" in this table indicates that any layer was not formed

The first cross section parallel to the interface of the substrate on the lower layer side, in a range from the interface of the intermediate layer on the upper layer side to 0.5 μm toward the substrate in the intermediate layer of the obtained sample, was observed with the FE-SEM, and the sum ($RSA_{Total}$) of the areas of the cross sections of the grains in each layer having the misorientation A in the range of 0 degrees or more and 45 degrees or less was measured using the EBSD incorporated in the FE-SEM. Then, the cross-sectional area of the grain having the misorientation A within the range of 0 degrees or more and 45 degrees or less was divided into divisions with a 5-degree pitch, and the area of grain cross sections in each division was determined. Then, the sum of the cross-sectional areas of grains for each division among a division with the misorientation A of 0 degrees or more to less than 10 degrees, a division of 10 degrees or more to less than 20 degrees, a division of 20 degrees or more to less than 30 degrees, and a division of 30 degrees or more to 45 degrees or less was determined. The sum of the cross-sectional areas of grains with 0 degrees or more and 45 degrees or less was taken as 100 area %. Then, a ratio of the cross-sectional areas of grains with a misorientation A in the range of 0 degrees or more and less than 10 degrees in each of these divisions to $RSA_{Total}$ was taken as RSA. The above measurement results are shown in Table 7 hereinbelow. The measurement by EBSD was performed as follows. The sample was set in the FE-SEM. The sample was irradiated with an electron beam with an acceleration voltage of 15 kV and an irradiation current of 1.0 nA at an incident angle of 70 degrees. In the measurement range of 30 μm×50 μm, the misorientation and cross-sectional area of each grain were measured by setting the EBSD to a step size of 0.1 μm. The cross-sectional area of the grains of the intermediate layer within the measurement range was taken as the total of pixels corresponding to the area. That is, the sum of the cross-sectional areas of grains in each division for each 10-degree or 15-degree pitch based on the misorientation A of grains in each layer was determined by summing up the pixels occupied by the grain cross-section corresponding to each division and converting the sum to the area.

The second cross section parallel to the interface of the substrate on the lower layer side, in a range from the interface of the upper layer on the intermediate layer side to 0.5 μm toward the opposite side thereof in the upper layer of the obtained sample, was observed with the FE-SEM, and the sum ($RSB_{Total}$) of the areas of the cross sections of the grains in each layer having the misorientation B in the range of 0 degrees or more and 45 degrees or less was measured using the EBSD incorporated in the FE-SEM. Then, the cross-sectional area of grains having the misorientation B within the range of 0 degrees or more and 45 degrees or less was divided into divisions with a 5-degree pitch, and the area of grain cross sections in each division was determined. Then, the sum of the cross-sectional areas of grains for each division among a division with a misorientation B of 0 degrees or more to less than 10 degrees, a division of 10 degrees or more to less than 20 degrees, a division of 20 degrees or more to less than 30 degrees, and a division of 30 degrees or more to 45 degrees or less was determined. The sum of the cross-sectional areas of grains with 0 degrees or more and 45 degrees or less was taken as 100 area %. Then, a ratio of the cross-sectional areas of grains with the misorientation B in the range of 0 degrees or more and less than 10 degrees in each of these divisions to $RSB_{Total}$ was taken as RSB. The above measurement results are shown in Table 7 hereinbelow. The measurement by EBSD was performed as follows. The sample was set in the FE-SEM. The sample was irradiated with an electron beam with an acceleration voltage of 15 kV and an irradiation current of 1.0 nA at an incident angle of 70 degrees. In the measurement range of 30 μm×50 μm, the misorientation and cross-sectional area of each grain were measured by setting the EBSD to a step size of 0.1 μm. The cross-sectional area of grains of the upper layer within the measurement range was taken as the total of pixels corresponding to the area. That is, the sum of the cross-sectional areas of grains in each division for each 10-degree or 15-degree pitch based on the misorientation B of the grains in each layer was determined by summing up the pixels occupied by the grain cross-section corresponding to each division and converting the sum to the area.

TABLE 7

| | Intermediate layer RSA$_{Total}$ (100 area %) | | | | Upper layer RSB$_{Total}$ (100 area %) | | | |
|---|---|---|---|---|---|---|---|---|
| | RSA 0 degree or more and less than 10 degrees | 10 degree or more and less than 20 degrees | 20 degree or more and less than 30 degrees | 30 degree or more and 45 degrees or less | RSB 0 degree or more and less than 10 degrees | 10 degree or more and less than 20 degrees | 20 degree or more and less than 30 degrees | 30 degree or more and 45 degrees or less |
| Invention Sample 1 | 63 | 12 | 10 | 15 | 52 | 15 | 13 | 20 |
| Invention Sample 2 | 41 | 20 | 18 | 21 | 50 | 18 | 15 | 17 |
| Invention Sample 3 | 71 | 9 | 8 | 12 | 54 | 14 | 13 | 19 |
| Invention Sample 4 | 63 | 12 | 10 | 15 | 42 | 23 | 20 | 15 |
| Invention Sample 5 | 64 | 13 | 9 | 14 | 72 | 12 | 10 | 6 |
| Invention Sample 6 | 64 | 12 | 10 | 14 | 50 | 18 | 15 | 17 |
| Invention Sample 7 | 63 | 12 | 10 | 15 | 51 | 17 | 15 | 17 |
| Invention Sample 8 | 63 | 12 | 10 | 15 | 52 | 16 | 17 | 15 |
| Invention Sample 9 | 61 | 15 | 12 | 12 | 51 | 15 | 13 | 21 |
| Invention Sample 10 | 63 | 12 | 10 | 15 | 53 | 17 | 15 | 15 |
| Invention Sample 11 | 61 | 13 | 11 | 15 | 50 | 17 | 17 | 16 |
| Invention Sample 12 | 63 | 12 | 10 | 15 | 52 | 15 | 14 | 19 |
| Invention Sample 13 | 62 | 14 | 12 | 12 | 51 | 17 | 16 | 16 |
| Invention Sample 14 | 63 | 12 | 10 | 15 | 52 | 18 | 14 | 16 |
| Invention Sample 15 | 63 | 14 | 10 | 13 | 49 | 20 | 13 | 18 |
| Invention Sample 16 | 62 | 13 | 12 | 13 | 51 | 13 | 12 | 24 |
| Invention Sample 17 | 64 | 12 | 10 | 14 | 54 | 14 | 10 | 22 |
| Comparative Sample 1 | 20 | 22 | 26 | 32 | 50 | 17 | 17 | 16 |
| Comparative Sample 2 | 63 | 12 | 10 | 15 | 23 | 22 | 25 | 30 |
| Comparative Sample 3 | 64 | 13 | 9 | 14 | 52 | 16 | 17 | 15 |
| Comparative Sample 4 | 63 | 12 | 10 | 15 | 51 | 17 | 15 | 17 |
| Comparative Sample 5 | 21 | 23 | 22 | 34 | 21 | 24 | 22 | 33 |
| Comparative Sample 6 | 22 | 20 | 24 | 34 | 22 | 23 | 20 | 35 |
| Comparative Sample 7 | 21 | 22 | 23 | 34 | 21 | 23 | 22 | 34 |
| Comparative Sample 8 | 20 | 21 | 19 | 40 | 21 | 24 | 21 | 34 |
| Comparative Sample 9 | 63 | 12 | 10 | 15 | 19 | 24 | 20 | 37 |

Cutting tests 1 and 2 were conducted using the obtained samples, i.e., invention samples 1 to 17 and comparative samples 1 to 9, under the following conditions. Cutting test 1 is a wear test for evaluating wear resistance, and cutting test 2 is a fracture test for evaluating fracture resistance. The results of the respective cutting tests are shown in Table 8.

Cutting Test 1
Workpiece material: S45C round bar,
Cutting speed: 210 m/min,
Feed: 0.25 mm/rev,
Depth of cut: 1.8 mm
Coolant: used,
Evaluation items: a time when the sample was fractured or had a maximum flank wear width of 0.3 mm was defined as the end of the tool life, and the machining time to reach the end of the tool life was measured. Moreover, the damage state at a processing time of 15 min was confirmed by SEM.

Cutting Test 2
Workpiece material: S45C round bar with two grooves
Cutting speed: 140 m/min,
Feed: 0.25 mm/rev,
Depth of cut: 1.5 mm,
Coolant: used,
Evaluation items: a time when the sample was fractured or had a maximum flank wear width of 0.3 mm was defined as the end of the tool life, and the machining time to reach the end of the tool life was measured, and the number of shocks until the end of the tool life was measured. Further, the damage state when the number of shocks reached 5000 shocks was checked with an SEM. The number of shocks was set up to 15,000.

As to the machining time to reach the end of the tool life in cutting test 1 (wear test), evaluations were made with grade "A" for 40 minutes or more, grade "B" for 30 minutes or more and less than 40 minutes, and grade "C" for less than 30 minutes. Further, as to the number of shocks until the end of the tool life in cutting test 2 (fracture test), evaluations were made with grade "A" for 13,000 or more, grade "B" for 11,000 or more and 12,999 or less, and grade "C" for 10,999 or less. In such evaluations, "A" refers to excellent, "B" refers to good and "C" refers to inferior, meaning that a sample involving a larger number of "A"s or "B"s has more excellent cutting performance. The evaluation results are shown in Table 8.

TABLE 8

| | Wear test Cutting test 1 | | | Chipping test Cutting test 2 | | |
|---|---|---|---|---|---|---|
| | Damage state at machining time of 15 min | Machining time (min) | Grade | Damage state at 5000 impacts | Number of shocks (shocks) | Grade |
| Invention Sample 1 | Normal wear | 48 | A | Normal wear | 14100 | A |
| Invention Sample 2 | Normal wear | 38 | B | Normal wear | 14200 | A |
| Invention Sample 3 | Normal wear | 52 | A | Normal wear | 14400 | A |
| Invention Sample 4 | Normal wear | 42 | A | Normal wear | 13500 | A |
| Invention Sample 5 | Normal wear | 51 | A | Normal wear | 15000 | A |
| Invention Sample 6 | Normal wear | 41 | A | Normal wear | 13300 | A |
| Invention Sample 7 | Normal wear | 53 | A | Normal wear | 14000 | A |
| Invention Sample 8 | Normal wear | 58 | A | Normal wear | 13600 | A |
| Invention Sample 9 | Normal wear | 42 | A | Normal wear | 14400 | A |
| Invention Sample 10 | Normal wear | 46 | A | Normal wear | 14000 | A |
| Invention Sample 11 | Normal wear | 48 | A | Normal wear | 13800 | A |
| Invention Sample 12 | Normal wear | 35 | B | Normal wear | 14000 | A |
| Invention Sample 13 | Normal wear | 57 | A | Normal wear | 12500 | B |
| Invention Sample 14 | Normal wear | 48 | A | Normal wear | 14100 | A |
| Invention Sample 15 | Normal wear | 45 | A | Normal wear | 14300 | A |
| Invention Sample 16 | Normal wear | 51 | A | Normal wear | 13300 | A |
| Invention Sample 17 | Normal wear | 50 | A | Normal wear | 13900 | A |
| Comparative Sample 1 | Normal wear | 26 | C | Normal wear | 14100 | A |
| Comparative Sample 2 | Falling of $Al_2O_3$ grains | 29 | C | Chipping | 11900 | B |
| Comparative Sample 3 | Chipping | 12 | C | Chipping | 8800 | C |
| Comparative Sample 4 | Falling of $Al_2O_3$ grains | 26 | C | Chipping | 9600 | C |
| Comparative Sample 5 | Falling of $Al_2O_3$ grains | 25 | C | Chipping | 12100 | B |
| Comparative Sample 6 | Falling of $Al_2O_3$ grains | 28 | C | Chipping | 12200 | B |
| Comparative Sample 7 | Falling of $Al_2O_3$ grains | 24 | C | Chipping | 12400 | B |
| Comparative Sample 8 | Falling of $Al_2O_3$ grains | 20 | C | Normal wear | 12800 | B |
| Comparative Sample 9 | Falling of $Al_2O_3$ grains | 27 | C | Chipping | 12000 | B |

The results in Table 8 show that each invention sample had grade "A" or "B" in both the wear test and the fracture test. Meanwhile, as to the evaluations made on the comparative samples, each comparative sample had grade "C" in either or both of the wear test and the fracture test. In particular, in the wear test, each invention sample had grade "B" or higher while each comparative sample had grade "C". Accordingly, it is apparent that the wear resistance of each invention sample is more excellent than that of each comparative sample.

It is apparent from the above results that each invention sample has excellent wear resistance and fracture resistance, thereby resulting in a longer tool life.

INDUSTRIAL APPLICABILITY

The coated cutting tool according to the present invention has excellent wear resistance while not involving a reduction in fracture resistance so that the tool life can be extended more than that involved in the prior art, and from such perspective, the coated cutting tool has industrial applicability.

REFERENCE SIGNS LIST

1: Substrate, 2: Lower layer, 3: Intermediate layer, 4: Upper layer, 5: Coating layer, 6: Coated cutting tool.

What is claimed is:

1. A coated cutting tool comprising a substrate and a coating layer formed on a surface of the substrate, wherein:
the coating layer comprises a lower layer, an intermediate layer, and an upper layer in this order from the substrate side;
the lower layer comprises one or two or more Ti compound layers containing a Ti compound of Ti and an element of at least one kind selected from the group consisting of C, N, O and B, the intermediate layer comprises an $\alpha$-$Al_2O_3$ layer containing $\alpha$-$Al_2O_3$, and the upper layer comprises a TiCNO layer containing TiCNO;
an average thickness of the coating layer is 5.0 μm or more and 30.0 μm or less;
in a first cross section parallel to an interface of the substrate on the lower layer side, in a range from the interface of the intermediate layer on the upper layer side up to 1 μm toward the substrate, a misorientation A satisfies a condition represented by a following formula (i); and
in a second cross section parallel to the interface of the substrate on the lower layer side, in a range from the interface of the upper layer on the intermediate layer side up to 1 μm toward the interface on the opposite side thereof, a misorientation B satisfies a condition represented by a following formula (ii):

$RSA \geq 40$     (i)

in the formula (i), RSA is a ratio, in terms of area %, of a cross-sectional area of grains having a misorientation A of 0 degrees or more to less than 10 degrees to a cross-sectional area of grains having a misorientation A of 0 degrees or more and 45 degrees or less in the first cross section, and the misorientation A is an angle, in terms of degrees, formed by a normal to the first cross section and a normal to a (001) orientation of a grain of the α-Al$_2$O$_3$ layer in the intermediate layer; and $$RSB \geq 40 \qquad (ii)$$

in the formula (ii), RSB is a ratio, in terms of area %, of a cross-sectional area of grains having the misorientation B of 0 degrees or more to less than 10 degrees to a cross-sectional area of grains having a misorientation A of 0 degrees or more and 45 degrees or less in the second cross section, and the misorientation B is an angle, in terms of degrees, formed by a normal to the second cross section and a normal to a (111) orientation of a grain of the TiCNO layer in the upper layer.

2. The coated cutting tool according to claim 1, wherein the RSA is 50 area % or more.

3. The coated cutting tool according to claim 1, wherein the RSB is 50 area % or more.

4. The coated cutting tool according to claim 1, wherein the upper layer is composed of a TiCNO layer containing a compound having a composition represented by a following formula (1):

$$Ti(C_{1-x-y}N_xO_y) \qquad (1)$$

wherein x denotes an atomic ratio of N element based on a total of C element, N element and O element, y denotes an atomic ratio of O element based on the total of C element, N element and O element, and $0.15 \leq x \leq 0.65$ and $0.01 \leq y \leq 0.20$.

5. The coated cutting tool according to claim 1, wherein an average thickness of the upper layer is 1.0 μm or more and 6.0 μm or less.

6. The coated cutting tool according to claim 1, wherein an average thickness of the intermediate layer is 3.0 μm or more and 15.0 μm or less.

7. The coated cutting tool according to claim 1, wherein an average thickness of the lower layer is 3.0 μm or more and 15.0 μm or less.

8. The coated cutting tool according to claim 1, wherein the Ti compound constituting the Ti compound layer is at least one selected from the group consisting of TiN, TiC, TiCN, TiCNO, TiON, and TiB$_2$.

9. The coated cutting tool according to claim 1, wherein the substrate is any one of cemented carbide, cermet, ceramic, or cubic boron nitride sintered body.

10. The coated cutting tool according to claim 2, wherein the RSB is 50 area % or more.

11. The coated cutting tool according to claim 2, wherein the upper layer is composed of a TiCNO layer containing a compound having a composition represented by a following formula (1):

$$Ti(C_{1-x-y}N_xO_y) \qquad (1)$$

wherein x denotes an atomic ratio of N element based on a total of C element, N element and O element, y denotes an atomic ratio of O element based on the total of C element, N element and O element, and $0.15 \leq x \leq 0.65$ and $0.01 \leq y \leq 0.20$.

12. The coated cutting tool according to claim 3, wherein the upper layer is composed of a TiCNO layer containing a compound having a composition represented by a following formula (1):

$$Ti(C_{1-x-y}N_xO_y) \qquad (1)$$

wherein x denotes an atomic ratio of N element based on a total of C element, N element and O element, y denotes an atomic ratio of O element based on the total of C element, N element and O element, and $0.15 \leq x \leq 0.65$ and $0.01 \leq y \leq 0.20$.

13. The coated cutting tool according to claim 10, wherein the upper layer is composed of a TiCNO layer containing a compound having a composition represented by a following formula (1):

$$Ti(C_{1-x-y}N_xO_y) \qquad (1)$$

wherein x denotes an atomic ratio of N element based on a total of C element, N element and O element, y denotes an atomic ratio of O element based on the total of C element, N element and O element, and $0.15 \leq x \leq 0.65$ and $0.01 \leq y \leq 0.20$.

14. The coated cutting tool according to claim 2, wherein an average thickness of the upper layer is 1.0 μm or more and 6.0 μm or less.

15. The coated cutting tool according to claim 3, wherein an average thickness of the upper layer is 1.0 μm or more and 6.0 μm or less.

16. The coated cutting tool according to claim 4, wherein an average thickness of the upper layer is 1.0 μm or more and 6.0 μm or less.

17. The coated cutting tool according to claim 10, wherein an average thickness of the upper layer is 1.0 μm or more and 6.0 μm or less.

18. The coated cutting tool according to claim 11, wherein an average thickness of the upper layer is 1.0 μm or more and 6.0 μm or less.

19. The coated cutting tool according to claim 12, wherein an average thickness of the upper layer is 1.0 μm or more and 6.0 μm or less.

20. The coated cutting tool according to claim 13, wherein an average thickness of the upper layer is 1.0 μm or more and 6.0 μm or less.

* * * * *